United States Patent
Inokuchi et al.

(10) Patent No.: US 8,012,885 B2
(45) Date of Patent: Sep. 6, 2011

(54) MANUFACTURING METHOD OF SEMICONDUCTOR DEVICE

(75) Inventors: Yasuhiro Inokuchi, Toyama (JP); Atsushi Moriya, Toyama (JP); Yasuhiro Ogawa, Hamura (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 85 days.

(21) Appl. No.: 12/078,527

(22) Filed: Apr. 1, 2008

(65) Prior Publication Data
US 2008/0242064 A1 Oct. 2, 2008

(30) Foreign Application Priority Data

Apr. 2, 2007 (JP) ................................. 2007-096035
Mar. 26, 2008 (JP) ................................. 2008-080913

(51) Int. Cl.
*H01L 21/20* (2006.01)
(52) U.S. Cl. .................. 438/761; 438/758; 257/E21.09
(58) Field of Classification Search .................. 438/478, 438/758, 715, 166, 30, 197, 153, 266, 308, 438/311, 604, 680, 743, 795, 930, 761; 257/E21.109, E21.461, E21.092, E21.097, 257/E21.102, E21.115, E21.562, E21.121, 257/E21.104, E21.704, E21.413, E21.416, 257/E23.09
See application file for complete search history.

(56) References Cited

U.S. PATENT DOCUMENTS

| | | | |
|---|---|---|---|
| 5,365,877 A * | 11/1994 | Kubota | 117/93 |
| 6,190,453 B1 * | 2/2001 | Boydston et al. | 117/89 |
| 6,399,429 B1 * | 6/2002 | Yamoto et al. | 438/166 |
| 6,500,719 B1 * | 12/2002 | Hahn | 438/300 |
| 6,514,886 B1 * | 2/2003 | U'Ren | 438/791 |
| 6,949,474 B2 * | 9/2005 | Moriya et al. | 438/761 |

FOREIGN PATENT DOCUMENTS

| | | |
|---|---|---|
| JP | A-5-259091 | 10/1993 |
| JP | A-7-66191 | 3/1995 |

\* cited by examiner

*Primary Examiner* — A. Sefer
*Assistant Examiner* — Allen Parker
(74) *Attorney, Agent, or Firm* — Oliff & Berridge, PLC

(57) ABSTRACT

To provide a manufacturing method of a semiconductor device capable of performing a selective growth at a low temperature. A manufacturing method of a semiconductor device for placing in a processing chamber a substrate having at least a silicon surface and an insulating film surface on a surface; and allowing an epitaxial film to selectively grow only on the silicon surface by using a substrate processing apparatus for heating an atmosphere in the processing chamber and the substrate, using a heating unit disposed outside of the processing chamber, includes a substrate loading step of loading the substrate into the processing chamber; a pre-processing step of supplying dichlorosilane gas and hydrogen gas into the processing chamber while maintaining a temperature in the substrate processing chamber to a prescribed temperature of 700° C. or less, and removing a natural oxide film or impurities formed on the silicon surface; and a substrate unloading step of unloading the substrate to outside of the processing chamber.

8 Claims, 3 Drawing Sheets

MANUFACTURING METHOD OF SEMICONDUCTOR DEVICE

BACKGROUND

1. Technical Field

The present invention relates to a manufacturing method of a semiconductor device for forming a film such as silicon or silicon germanium on a silicon substrate.

2. Background Art

Generally, a silicon substrate is used as a semiconductor substrate, and on a silicon surface and on a substrate having an insulating film such as a silicon nitride film, a technique of allowing an epitaxial film to selectively grow only on the silicon surface is studied. Note that a selective growth refers to the technique of allowing a film to selectively grow only on the surface of silicon.

For example, although further micronization and high performance of MOSFET (Metal-Oxide-Semiconductor-Field-Effect-Transistor) is progressed, low resistance tendency of a contact resistance is given as a problem for forming a source/drain of the MOSFET, and as one of the methods for solving such a problem, an attempt to allow a silicon epitaxial film to grow on the source/drain.

Also, in recent years, the following technique has been focused. Namely, the source/drain is etched in a recess state, and a scraped source/drain part is doped with C (carbon), etc, having a different lattice constant to allow the silicon epitaxial film to selectively grow thereon, thus giving a strain to a channel, so that a high performance of a transistor is realized.

Incidentally, in case of the selective growth of silicon or silicon germanium, etc, a natural oxide film or impurities on the substrate must be removed. As such a processing method, a hydrogen reduction method is used, wherein $H_2$ gas is used as a reductive gas.

However, in order to obtain a sufficient effect by the hydrogen reduction method, reduction processing needs to be performed at a high temperature of 800° C. or more, thus making a problem more serious, such as a thermal damage of a substrate element and increase of a thermal budget. Also, in a conventional method, there is a problem that pre-cleaning process by dilute hydrofluoric acid, etc, is required before reduction processing, thus taking a lot of trouble over such a pre-cleaning.

Therefore, an object of the present invention is to provide a manufacturing method of a semiconductor device capable of realizing the selective growth at a low temperature.

SUMMARY OF THE INVENTION

In order to achieve the above-described object, the present invention provides a manufacturing method of a semiconductor device, wherein a substrate having at least a silicon surface and an insulating film surface on a front surface is placed in a processing chamber, and by using a substrate processing apparatus for heating an atmosphere in the processing chamber and the substrate by a heating unit disposed outside of the processing chamber, an epitaxial film is allowed to selectively grow only on the silicon surface, including: a substrate loading step of loading the substrate into the processing chamber; a pre-processing step of removing a natural oxide film or impurities formed on the silicon surface by supplying dichlorosilane gas and hydrogen gas into the processing chamber while maintaining a temperature of the substrate and the inside of the substrate processing chamber to a prescribed temperature of 700° C. or less; and a substrate unloading step of unloading the substrate to outside of the processing chamber.

According to the present invention, an epitaxial growth film or a growth layer can be formed only on the silicon surface of the substrate having at least the silicon surface and the insulating film surface. In addition, an interface between the epitaxial growth film or the grow layer and the silicon surface can be cleaned and high quality can be achieved. Further, since the interface between the silicon surface and the epitaxial growth film or the growth layer can be cleaned and the processing temperature of the epitaxial growth can be set at 800° C. or less, possibility of the thermal damage on the substrate element and the thermal budged can be significantly reduced. Further, since etching as the pre-processing before selective growth can be eliminated, reduction of cost can be achieved. In addition, particularly, when the natural oxide film or the impurities on the silicon surface are removed by reduction using $SiH_2Cl_2$ (dichlorosilane gas), there is a possibility that a silicon film or a silicon nucleus is formed on the insulating film of the substrate when the processing temperature is high. However, in order to make the epitaxial film grow only the silicon surface of the substrate, it is necessary to prevent the silicon film or the silicon nucleus from being formed on the insulating film. However, the processing temperature for removing the natural oxide film or the impurities on the silicon surface can be set at 800° C. or less, thus making it possible to prevent the silicon film or the silicon nucleus from being formed on the insulating film and prevent a harmful influence such as a deflection in the selective growth thereafter.

DESCRIPTION OF PREFERRED EMBODIMENTS OF THE INVENTION

In the best mode for carrying out the present invention, a substrate processing apparatus is constituted as a semiconductor manufacturing device for executing the processing steps in a manufacturing method of a semiconductor device (IC). Note that in an explanation hereunder, as a substrate processing apparatus, a case of using a vertical apparatus (simply called a processing apparatus hereunder) for applying oxidization, diffusion processing or CVD processing to a substrate will be described.

Figure 1:
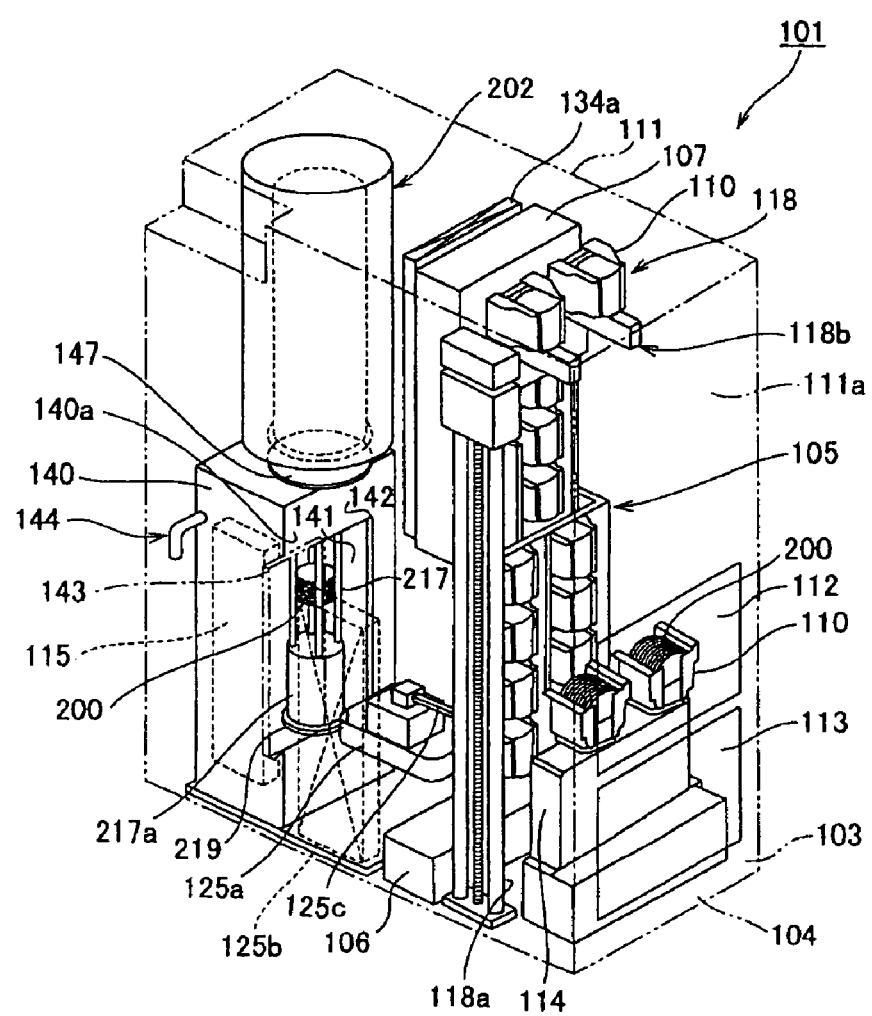
FIG. 1 is an obliquely perspective view of a substrate processing apparatus applied to the present invention.

FIG. 1 is an obliquely perspective view of the substrate processing apparatus used in the present invention. As shown in FIG. 1, a casing 111 is included in the substrate processing apparatus of the present invention using a cassette 110, being a wafer carrier storing the substrate (called a wafer hereunder) 200 made of silicon, etc. A front side maintenance port 103 is opened in a lower part of a front side wall 111a of the casing 111, as an opening part provided to perform maintenance, and a maintenance door 104 for opening/closing this front side maintenance port 103 is built. A cassette loading/unloading port (substrate container loading/unloading port) 112 is opened on the front side maintenance door 104, so as to communicate inside/outside of the casing 111, and the cassette loading/unloading port 112 is opened/closed by a front shutter (substrate container loading/unloading port open-close mechanism) 113. A cassette stage (substrate container transfer table) 114 is installed inside of the casing 111 of the cassette loading/unloading port 112. The cassette 110 is loaded on a cassette stage 114 by an in-step transport device (not shown), and is unloaded from the cassette stage 114. By the in-step transport device, the cassette stage 114 is constituted so that the wafer 200 in the cassette 110 is placed thereon in a vertical posture, with a wafer charging/discharging port of the cassette 110 directed upward.

A cassette shelf (substrate container placement shelf) 105 is installed in approximately a lower center in a longitudinal direction in the casing 111, so that the cassette shelf 105 stores a plurality of cassettes 110 in multiple stages and in multiple rows, to allow the wafer 200 in the cassette 110 to be charged/discharged. The cassette shelf 105 is installed on a slide stage (horizontal moving mechanism) so as to be laterally moved thereon.

In addition, a buffer shelf (substrate container storage shelf) 107 is installed in an upper part of the cassette shelf 105, so that the cassette 110 can be stored therein.

A cassette transport device (substrate container transport device) 118 is installed between the cassette stage 114 and the cassette shelf 105. The cassette transport device 118 is constituted of a cassette elevator (substrate container elevation mechanism) capable of elevating the cassette 110 in a holding state of the cassette 110, and a cassette transport mechanism (substrate container transport mechanism) 118b as a transport mechanism, and by continuous operation of the cassette elevator 118a and the cassette transport mechanism 118b, the cassette 110 is transported among the cassette stage 114, the cassette shelf 105, and the buffer shelf 107.

A wafer transfer mechanism (substrate transfer mechanism) 125 is installed behind the cassette shelf 105, and the wafer transfer mechanism 125 is constituted of a wafer 200 transfer device (substrate transfer device) 125a capable of horizontally rotating or straightly moving the wafer 200, and a wafer transfer device elevator (substrate transfer device elevation mechanism) 125b for elevating the wafer transfer device 125a.

As schematically shown in FIG. 1, the wafer transfer device elevator 125b is installed on a left side end portion of a withstand pressure casing 111. By the continuous operation of these wafer transfer device elevator 125b and wafer transfer device 125a, the wafer 200 can be charged or discharged into/from a boat (substrate holder), with a tweezer (substrate holding body) 125c of the wafer transfer device 125a sets a placement part of the wafer 200.

As shown in FIG. 1, a clean unit 134a constituted of a supply fan and a dust-proof filter for supplying clean air, being a cleaned atmosphere, is provided behind the buffer shelf 107, so that the clean air can be circulated through the inside of the casing 111. In addition, a clean unit not shown constituted of the supply fan and the dust-proof filter for supplying the clean air is installed on a right side end portion, being the opposite side to the side of the wafer transfer device elevator 125b, so that the clean air blown out from the clean unit is circulated through the wafer transfer device 125a and thereafter is sucked into an exhaust device not shown, and is exhausted to the outside of the casing 111.

A casing (called a withstand pressure casing hereunder) 140 having a tightness performance capable of maintaining a pressure of under atmospheric pressure (called a negative pressure hereunder) is installed behind the wafer transfer device (substrate transfer device) 125a, and a load lock stand-by chamber 141 is formed, being a stand-by chamber of a load lock system having a capacity capable of containing a boat 217 by this withstand pressure casing 140.

A wafer loading/unloading port (substrate loading/unloading port) 142 is opened on a front side wall 140a of the withstand pressure casing 140, so that the wafer loading/unloading port 142 can be opened/closed by a gate valve (substrate loading/unloading port open-close mechanism) 143. A gas supply pipe 144 for freeing inert gas such as nitrogen gas to the load lock chamber 141 and a gas exhaust pipe (not shown) for exhausting the load lock chamber 141 to a negative pressure are respectively connected to a pair of side walls of the withstand pressure casing 140.

A processing furnace 202 is provided in an upper part of the load lock chamber 141. A lower end portion of the processing furnace 202 is opened/closed by a throat gate valve (throat open-close mechanism).

As schematically shown in FIG. 1, a boat elevator (substrate holding tool elevation mechanism) 115 for elevating the boat 217 is installed in the load lock chamber 141. A seal cap 219, being a lid member, is horizontally installed on an arm not shown as a connecting tool connected to the boat elevator 115, so that the seal cap 219 that supports the boat 217 vertically, so that the lower end portion of the processing furnace 202 can be closed.

The boat 217 includes a plurality of holding members, so that the wafer 200 can be horizontally maintained respectively, with a plurality of wafers 200 (for example 50 to 150 sheets of wafers) arranged vertically, with centers thereof aligned.

Next, an operation of the processing apparatus of the present invention will be explained.

As shown in FIG. 1, prior to supplying the cassette 110 to the cassette stage 114, the cassette loading/unloading port 112 is opened by the front shutter 113. Thereafter, the cassette 110 is loaded from the cassette loading/unloading port 112, and is placed on the cassette stage 114, so that the wafer 200 is set in a vertical posture and the wafer charging/discharging port of the cassette 110 is directed upward.

Next, the cassette 110 is scooped up from the cassette stage 114 by the cassette transport device 118, and is rotated by 90° clockwise in a vertical direction backward of the casing, so that the wafer 200 in the cassette 110 is set in a horizontal posture, and the wafer charging/discharging port of the cassette 110 is directed backward of the casing.

Subsequently, the cassette 110 is automatically transported to a shelf position designated by the cassette shelf 105 or the buffer shelf 107 by the cassette transport device 118, and stored therein temporarily, and thereafter transferred to the cassette shelf 105 or transported to the cassette shelf 105 directly.

The slide stage 106 moves the cassette shelf 105 horizontally and positions the cassette 110 to be transferred so as to face the wafer transfer device 125a.

When the wafer loading/unloading port 142 of the load lock chamber 141, with inside previously set in an atmospheric state, is opened by the operation of the gate valve 143, the wafer 200 is picked up through the wafer charging/discharging port by the tweezer 125c of the wafer transfer device 125a, and loaded in the load lock chamber 141 through the wafer loading/unloading port 142, and transferred and charged into the boat 217 (wafer charging). The wafer transfer device 125a, whereby the wafer 200 is transferred to the boat 217, returns to the cassette 110 and charges the next wafer 200 into the boat 217.

When previously designated numbers of wafers 200 are charged into the boat 217, the wafer loading/unloading port 142 is closed by the gate valve 143, and the load lock chamber 141 is evacuated from the exhaust pipe, thereby the pressure inside thereof is reduced. When the pressure inside of the load lock chamber 141 is reduced to the same pressure as the inside of the processing furnace 202, the lower end portion of the processing furnace 202 is opened by the throat gate valve 147. Subsequently, the seal cap 219 is elevated by the boat elevator 115, and the boat 217 supported by the seal cap 219 is loaded into the processing furnace 202.

After loading the boat 217, an arbitrary processing is applied to the wafer 200 in the processing furnace 202.

After such a processing is done, the boat 217 is taken out by the boat elevator 115, and further, the gate valve 143 is opened after the inside of the load lock chamber 141 is returned to the atmospheric pressure. Thereafter, the wafer and the cassette 110 are discharged to the outside of the casing 111 in an opposite procedure to the aforementioned procedure.

Figure 2:
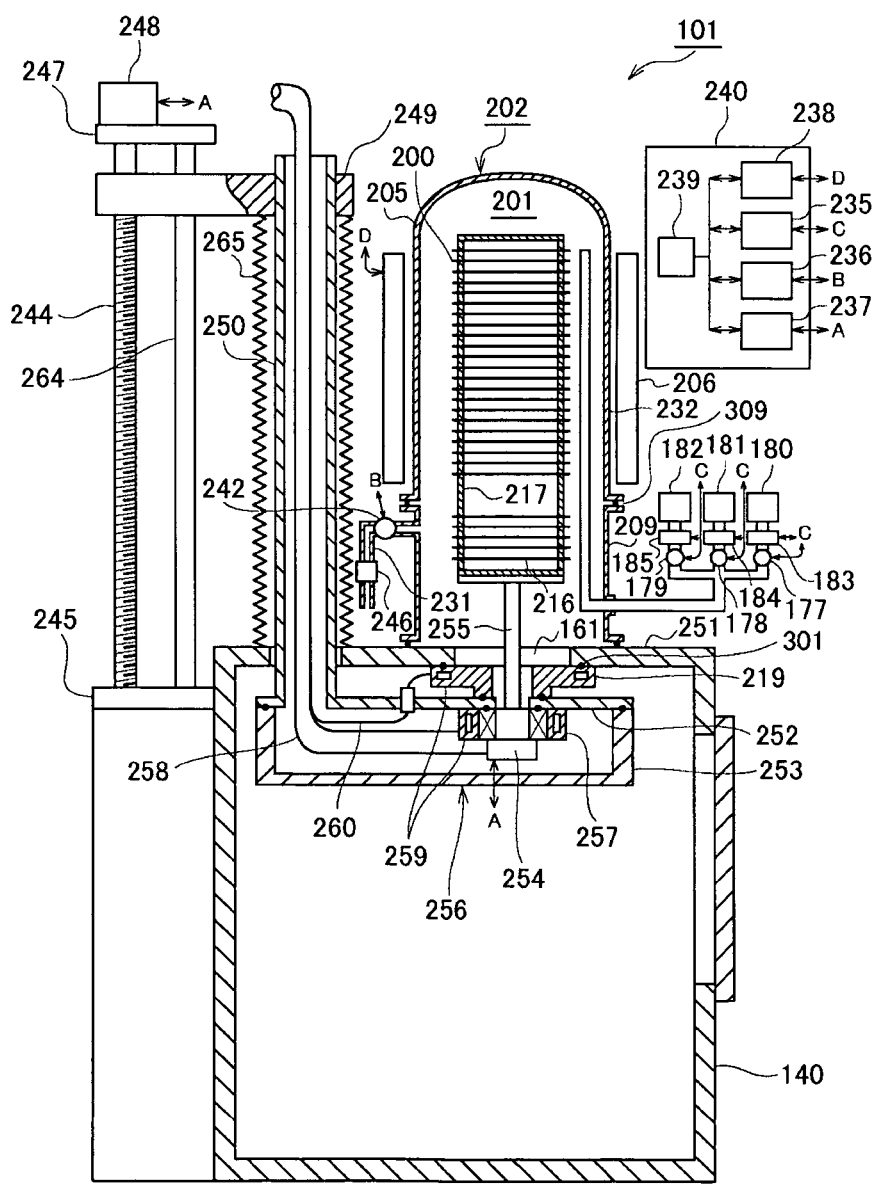
FIG. 2 is a schematic block diagram of a processing furnace and the periphery of a processing furnace of the substrate processing apparatus according to an embodiment of the present invention.

FIG. 2 is a schematic block diagram of the processing furnace 202 and a periphery of the processing furnace 202 of the substrate processing apparatus, and is shown as a vertical sectional view.

As shown in FIG. 2, the processing furnace 202 has a heater 206 as a heating mechanism.

The heater 206 has a cylindrical shape, and is constituted of a heater element and a heat insulating member provided around the heater element, and is vertically installed by being supported by the holding body not shown.

An outer tube 205 as a reaction tube is arranged inside of the heater 206, concentrically with the heater 206. The outer tube 205 is composed of a heat-resistant material such as quartz ($SiO_2$) or silicon carbide (SiC), and is formed in a cylindrical shape, with an upper end closed and lower end opened. A processing chamber 201 is formed in a hollow part inside of the outer tube 205, so that the wafers 200, being substrates, can be contained in a state of being arranged by the boat 217 vertically in a horizontal posture in multiple stages.

A manifold 209 is disposed below the outer tube 205, concentrically with the outer tube 205. The manifold 209 is made of, for example, stainless, etc, and is formed in a cylindrical shape, with the upper end and lower end opened. This manifold 209 is provided to support the outer tube 205. Note that an O-ring 309 as a seal member is provided between the manifold 209 and the outer tube 205. By supporting this manifold 209 by the holding body not shown, the outer tube 205 is set in a state of being installed vertically. Thus, a reaction vessel its formed by the outer tube 205 and the manifold 209.

A gas exhaust pipe 231 is provided in the manifold 209, and also a gas supply pipe 232 is provided so as to penetrate the manifold 209. The gas supply pipe 232 is branched into three parts on the upper stream side, which are connected to a first gas supply source 180, a second gas supply source 181, a third gas supply source 182, respectively via valves 177, 178, 179 and MFCs 183, 184, 185 as a gas flow rate control devices. A gas flow rate controller 235 is electrically connected to the MFCs 183, 184, 185 and the valves 177, 178, 179, so that the flow rate of supplied gas is controlled to be a desired flow rate at a desired timing.

A vacuum exhaust device 246 such as a vacuum pump is connected to the lower stream side of the gas exhaust pipe 231 via a pressure sensor as a pressure detector not shown and an APC valve 242 as an adjuster.

A pressure controller 236 is electrically connected to the pressure sensor and the APC valve 242, and the pressure controller 236 controls the pressure at a desired timing, so that the pressure in the processing chamber 201 is set at a desired pressure, by adjusting an opening degree of the APC valve 242 based on the pressure detected by the pressure sensor.

The seal cap 219 is provided below the manifold 209 as a throat lid member for air-tightly closing the lower end opening of the manifold 209. The seal cap 219 is made of metal such as stainless, and is formed in a disc shape. An O-ring 301 is provided on an upper surface of the seal cap 219, as a seal member that abuts on the lower end of the manifold 209.

A rotation mechanism 254 is provided in the seal cap 219. A rotary shaft 255 of the rotation mechanism 254 penetrates the seal cap 219 and is connected to the boat 217, so that the wafer 299 can be rotated by rotating the boat 217.

The seal cap 219 is elevated in a vertical direction by an elevation motor 248 as will be described later, being the elevation mechanism provided outside of the processing furnace 202, thus making it possible to load/unload the boat 217 into/from the processing chamber 201.

A drive controller 237 is electrically connected to the rotation mechanism 254 and the elevation motor 248, so as to control them to perform a desired operation at a desired timing.

The boat 217 as a substrate holding tool is composed of a heat-resistant material such as quartz or silicon carbide, and is constituted to hold a plurality of sheets of wafers 200 in a horizontal posture in a state of arranging them in multiple stages, with centers thereof aligned one another. Note that a plurality of heat insulating boards 216, being a heat insulating member of a disc shape composed of the heat-resistant material such as quartz or silicon carbide, are arranged in a horizontal posture in multiple stages, so that heat from the heater 206 is hardly transmitted to the side of the manifold 209.

A temperature sensor (not shown), being a temperature detecting body, is provided near the heater 206, for detecting the temperature in the processing chamber 201.

A temperature controller 238 is electrically connected to the heater 206 and the temperature sensor, and controls the temperature in the processing chamber 201 at a desired timing, so as to have a desired temperature distribution, by adjusting an energizing condition to the heater 206 based on temperature information detected by the temperature sensor.

In the structure of this processing furnace 202, the first processing gas is supplied from the first gas supply source 180, and is introduced into the processing chamber 201 by the gas supply pipe 232 after its flow rate is adjusted by the MFC 183.

In addition, the second processing gas is supplied from the second gas supply source 181, and is introduced into the processing chamber 201 by the gas supply pipe 232 via the valve 178, after its flow rate is adjusted by the MFC 184.

The third processing gas is supplied from the third gas supply source 182 and is introduced into the processing chamber 201 by the gas supply pipe 232 via the valve 179, after its flow rate is adjusted by the MFC 185.

In addition, the gas in the processing chamber 201 is exhausted from the processing chamber 201 by the vacuum pump, being the vacuum exhaust device 246 connected to the gas exhaust pipe 231.

Next, the structure of the periphery of the processing furnace 202 of the substrate processing apparatus 101 used in the present invention will be specifically explained.

A lower substrate 245 is provided on an outside face of the load lock chamber 141, being a spare chamber.

On the lower substrate 245, there is provided a guide shaft 264 that engages with an elevation table 249, and a ball screw 244 that screws into the elevation table 249. An upper substrate 247 is provided on upper ends of the guide shaft 264 and the ball screw 244 erected on the lower substrate 245.

The ball screw 244 is rotated by the elevation motor 248 provided on the upper substrate 247. The elevation table 249 is elevated by rotating the ball screw 244.

A hollow elevation shaft 250 is suspended from the elevation table 249, and a connection part between the elevation table 249 and the elevation shaft 250 is set in an air-tight state. The elevation shaft 250 is elevated together with the elevation table 249. The elevation shaft 250 is loosely inserted into a top plate 251 of the load lock chamber 141. A through hole of the top plate 251, into which the elevation shaft 250 is inserted, has a sufficient room so as not to be brought into contact with the elevation shaft 250.

A bellows 265, being a hollow expansion body having expansion property so as to cover the circumference of the elevation shaft 250 is provided between the load lock chamber 141 and the elevation table 249, to air-tightly maintain the load lock chamber 141.

The bellows has a sufficient expansion amount capable of responding to an elevation amount of the elevation table 249, and an inner diameter of the bellows 265 is sufficiently larger than an outer shape of the elevation shaft 250, so that the bellows 265 and the elevation shaft 250 are not brought into contact with each other by expansion of the bellows 265.

An elevation substrate 252 is horizontally fixed to the lower end of the elevation shaft 250. A drive portion cover 253 is air-tightly fitted to the lower surface of the elevation substrate 252 via a seal member such as an O-ring. A drive portion storage case 256 is constituted of the elevation substrate 252 and the drive portion cover 253. With this structure, the inside of the drive portion storage case 256 can be separated from the atmosphere of the load lock chamber 141.

In addition, the rotation mechanism 254 of the boat 217 is provided inside of the drive portion storage case 256, and the periphery of the rotation mechanism 254 is cooled by a cooling mechanism 257.

A power supply cable 258 is passed through the hollow part of the elevation shaft 250 from the upper end of the elevation shaft 250 and guided and connected to the rotation mechanism 254. In addition, cooling flow passages 259 are formed in the cooling mechanism 257 and the seal cap 219, and a cooling water piping 260 for supplying cooling water is connected to the cooling flow passage 259, and is passed through the hollow part of the elevation shaft 250 from the upper end of the elevation shaft 250.

By driving the elevation motor 248 and rotating the ball screw 244, the drive portion storage case 256 is elevated via the elevation table 249 and the elevation shaft 250.

When the drive portion storage case 256 is elevated, the throat 161, being the opening part of the processing furnace 202, is closed by the seal cap 219 which is air-tightly provided in the elevation substrate 252, and a state possible to perform wafer processing is provided. When the drive portion storage case 256 is lowered, the boat 217 is lowered together with the seal cap 219, and a state possible to unload the wafer 200 outside is provided.

The gas flow rate controller 235, the pressure controller 236, the drive controller 237, and the temperature controller 238 also constitute an operation part and an input/output part, and are electrically connected to a main controller 239 that controls an entire body of the substrate processing apparatus 101. The gas flow rate controller 235, the pressure controller 236, the drive controller 237, the temperature controller 238, and the main controller 239 constitute a controller 240.

Next, explanation will be given for a method of forming a film on the substrate such as the wafer 200, as one step of the manufacturing steps of a semiconductor device, by using the processing furnace 202 according to the aforementioned structure.

Note that in the explanation given hereunder, the operation of each part constituting the substrate processing apparatus 101 is controlled by the controller 240.

When a plurality of sheets of wafers 200 are charged into the boat 217, as shown in FIG. 2, the boat 217 having the wafer 200 held therein is loaded (boat loading) into the processing chamber 201 by an elevating operation of the elevation table 249 and the elevation shaft 250 driven by the elevation motor 248. In this state, the seal cap 219 is set in a state of sealing the lower end of the manifold 209 via the O-ring.

The inside of the processing chamber 201 is vacuum-exhausted by the vacuum exhaust device 246 so as to be a desired pressure (vacuum degree). At this time, the pressure in the processing chamber 201 is measured by the pressure sensor, and based on this measured pressure, the APC valve 242 as the pressure adjuster is feedback-controlled. In addition, the inside of the processing chamber 201 is heated by the heater 206 so as to be a desired temperature. At this time, the energizing condition to the heater 206 is feedback-controlled based on the temperature information detected by the temperature sensor, so that the inside of the processing chamber 201 has a desired temperature distribution. Subsequently, by rotating the boat 217 by the rotation mechanism 254, the wafer 200 is rotated.

For example, as the processing gas, $SiH_4$ or $Si_2H_6$, and $GaH_4$, and $H_2$ are enclosed in the first gas supply source 180, the second gas supply source 181, and the third gas supply source 182, respectively, and subsequently each processing gas is supplied from these processing gas supply sources. After the opening degrees of the MFCs 183, 184, and 185 are adjusted to obtain a desired flow rate, valves 176, 177, and 178 are opened, and each processing gas is circulated through the gas supply pipe 232 and is introduced into the processing chamber 201 from above the processing chamber 201. The introduced gas is passed through the inside of the processing chamber 201 and is exhausted from the gas exhaust pipe 231.

The processing gas is brought into contact with the wafer 200 when passing through the inside of the processing chamber 201, and an Epi-SiGe film is deposited on the surface of the wafer 200.

When deposition or epitaxial growth of the Si single crystal film is performed on the silicon surface of the silicon substrate, instead of the Epi-SiGe film, $SiH_2Cl_2$(dichlorosilane) is enclosed in any one of the first gas supply source 180, the second gas supply source 181, and the third gas supply source 182.

A gas introduction port of the gas supply pipe 232 is opened vertically downward so as to face the lower part of the processing chamber 201. Note that it may be so constituted that the gas supply pipe 232 is extended to the lower part of the processing chamber 201 toward the gas introduction port and the tip end portion is closed, and also a plurality of gas introduction ports are provided in an extension part of the gas supply pipe 232, and in this case, an opening area or an opening diameter of the gas supply pipe is adjusted based on a pressure loss of the gas supply pipe 232 to obtain the same flow rate of the processing gas introduced from each gas introduction port to between wafers 200.

When a previously set time is elapsed, the inert gas is supplied from the inert gas supply source not shown as a purge gas, to thereby replace the inside of the processing chamber 201 with the inert gas and the pressure in the processing chamber 201 is returned to a normal pressure.

Thereafter, the seal cap 219 is lowered by the rotation of the elevation motor 248, and the lower end of the manifold 209 is opened, and an already processed wafer 200 is unloaded to the outside of the outer tube 205 from the lower end of the manifold 209 in a state of holding the boat 217. Thereafter, the already processed wafer 200 is discharged from the boat 217 (wafer discharging).

Figure 3:
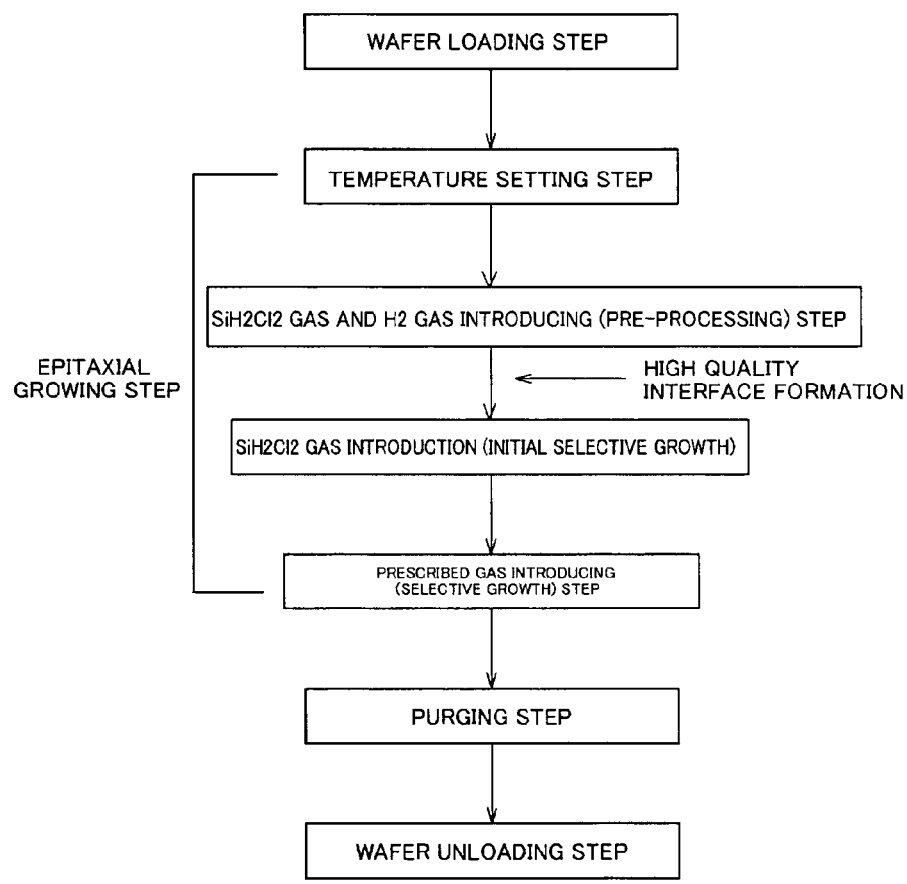
FIG. 3 is a view showing an example of a process sequence when a semiconductor device according to the present invention is manufactured by using the substrate processing apparatus, according to an embodiment of the present invention.

FIG. 3 shows an example of a process sequence of a case when the semiconductor device is manufactured by the epitaxial growth of the present invention, by using the substrate processing apparatus 101.

In the process sequence, a wafer loading step of inserting the wafer 200 into the processing chamber 201 in a state of being loaded in the boat 217; a pre-processing step of removing the natural oxide film or impurities from the silicon surface of the wafer 200; an epitaxial growing step of allowing the epitaxial film of Si single crystal to grow on the silicon surface of the wafer 200 after the pre-processing is executed; a purging step of exhausting the gas in the processing chamber 201 by the inert gas; and a wafer loading step of discharging the already processed wafer 200 from the processing chamber 201, are executed in this order. Note that the epitaxial growing step may be executed by one step or may be executed step by step.

Each step will be explained hereunder.

<Wafer Loading Step>

In the wafer loading step, the wafer (silicon substrate) 200 is charged into the holding member of the aforementioned boat 217, and by the elevation of the boat elevator 115, the boat 217 is loaded into the processing chamber 201. When loading of the boat 217 is finished and the throat 161 is closed by the seal cap 219, next, the atmosphere in the processing chamber 201 is exhausted by a vacuum pump, being the vacuum exhaust device 246 connected to the gas exhaust pipe 231, and the pressure inside of the processing chamber 201 is set at 300 Pa or less. When the pressure is maintained to 300 Pa or less, the wafer loading step is finished.

<Temperature Setting Step>

In the temperature setting step, the temperature of the atmosphere in the processing chamber 201 and the wafer 200 is heated to 600 to 700° C., being a pre-processing temperature, by heating of the heater 206. When the temperature is stabilized, this step is finished.

Pre-Processing Step of Wafer (Removing Step of Natural Oxide Film or Impurities on the Silicon Surface)>

In the pre-processing step, in order to remove the natural oxide film or the impurities on the silicon surface of the wafer 200, reduction gas and dilution gas are introduced.

$SiH_2Cl_2$ (dichlorosilane gas) is used as the reduction gas, and $H_2$ gas is used as the dilution gas.

The flow rate of the $SiH_2Cl_2$ (dichlorosilane gas) is set at 1 to 300 sccm, and the flow rate of the $H_2$ gas (hydrogen gas) is set at 10 to 50000 sccm.

In addition, the pressure in the processing chamber 201 is set at 300 pa or less, the temperature of the processing chamber 201 and the wafer 200 is maintained to from 600° to 700° C. and a reduction time by $SiH_2Cl_2$ gas is set at 5 to 120 minutes empirically.

When the $SiH_2Cl_2$ gas and the $H_2$ gas are introduced into the processing chamber 201, H and C of $SiH_2Cl_2$ are thermally decomposed.

The natural oxide film ($SiO_2$) and the impurities on the silicon surface are reacted with the thermally decomposed elements, then turned into a hydrogen compound and carbon compound, and exhausted from the gas exhaust pipe 231. Note that in this case, the $H_2$ gas does not work on a reductive reaction, because the temperature of the processing chamber 201 and the wafer 200 is set low such as 600 to 700° C.

In the pre-processing step of the wafer 200, when each condition value of the flow rate is outside the range of each condition value, the reductive action of $SiH_2Cl_2$ is reduced, thereby also reducing a removing capability to the natural oxide film (such as $SiO_2$) and impurities.

Introduction of $SIH_2Cl_2$ Gas (Initial Selection Growing Step)>

A first epitaxial growing step (processing step) will be shown hereunder.

In this step, the $SiH_2Cl_2$ gas (dichlorosilane gas) as a source gas of the epitaxial growth and the $H_2$ gas (hydrogen gas) as the dilution gas are introduced into the processing chamber 201, in a state of setting the wafer 200 in the processing chamber 201.

At this time, the pressure in the processing chamber 201 is set at 300 Pa or less, and the flow rate of the $SiH_2Cl_2$ (dichlorosilane) is set at 1 to 300 sccm, and the flow rate of the $H_2$ gas (hydrogen gas) is set at 10 to 50000 sccm, and the condition is set to be the same condition as that of the aforementioned pre-processing step. The inside of the processing chamber 201 and the wafer 200 is heated by a heater to the temperature within a range from 680 to 720° C.

The processing time is set at 5 to 120 minutes, although different depending on a film thickness or a layer thickness for allowing the film to epitaxial-grow.

When each condition value of the temperature, pressure, and flow rate is outside of the range of each condition value, the epitaxial growth using $SiH_2Cl_2$ is deteriorated.

When the $SiH_2Cl_2$ gas is introduced into the processing chamber 201 under the aforementioned epitaxial growth condition, the $SiH_2Cl_2$ gas is thermally decomposed on the surface of the wafer 200 cleaned in the pre-processing step, the Si single crystal film is allowed to selectively epitaxially grow only on the silicon surface of the wafer 200.

Note that the epitaxial growth may be performed up to a desired film thickness in this initial selection growing step, however when a growing speed is increased, the next growing step may be further executed.

In addition, as the epitaxial growing step, the epitaxial growth may be performed up to a desired film thickness in only the next growing step without performing this initial selective growth.

<Prescribe Gas Introduction Step (Selection Growing Step)>

The epitaxial growth condition in this step may be made same as the initial selection growing step. However, the pressure in the processing chamber 201, the flow rate of the $SiH_2Cl_2$ (dichlorosilane gas), and the flow rate of the $H_2$ gas (hydrogen gas) may be the same as the aforementioned pre-processing step and the initial selection growing step.

Then, the processing temperature is, for example, set at the temperature in a range from 720 to 800° C. Here, as an example, it is set at 760° C. In addition, when the temperature is increased for accelerating the epitaxial growth speed, the selective growth can not be performed only by the $SiH_2Cl_2$ gas and the $H_2$ gas (hydrogen gas). Therefore, in this case, for example, HCl is added suitably as a chlorine based gas. In this case, a preferable flow rate of the chlorine based gas, for example HCl gas is 1 to 300 sccm.

Thus, the Si single crystal can be grown on the Si single crystal that is epitaxial-grown in the initial selection growing step at a faster speed than that of the initial selection growing step.

Note that when GeH₄ gas is used instead of the dichlorosilane gas under the same condition as that of the selection growing step, the single crystal film or layer of silicon germanium can be grown.

In addition, the processing time in this step is in the range of 5 to 120 minutes, although it is different depending on the film thickness (layer thickness).

<Purging Step>

In the purging step, the inert gas is introduced into the processing chamber 201 from the inert gas supply source (not shown), and a residual gas in the processing chamber 201 is pushed out to the gas exhaust pipe 231 by the pressure of the inert gas. When the residual gas in the processing chamber 201 is replaced with the inert gas, the pressure in the processing chamber 201 is returned to a normal pressure.

<Wafer Unloading Step>

In the wafer unloading step, the boat elevator 115 is lowered, and the wafer 200 after performing epitaxial growth is discharged from the boat 217.

EXAMPLE

Next, an example of a manufacturing method of the semiconductor device according to the present invention will be explained.

Example

First, an atmosphere temperature of the processing chamber 201 and the temperature of the wafer 200 are set at 620° C., the pressure of the processing chamber 201 is set at 30 Pa, and the flow rate of the $SiH_2Cl_2$ (dichlorosilane) gas, being the reductive gas, is set at 200 sccm, and the flow rate of the $H_2$ gas (hydrogen gas), being the dilution gas, is set at 1000 sccm, and the pre-processing is applied for 60 minutes, with the wafer 200 having the silicon surface and the insulating film surface on the surface, set as a sample.

Next, while maintaining the temperature of the inside of the processing chamber 201 and the wafer 200 to 700° C., and maintaining the pressure inside of the processing chamber 201 to 30 Pa, $SiH_2Cl_2$ (dichlorosilane), being a epitaxial growth source material, and the $H_2$ gas (hydrogen gas), being the dilution gas, are introduced into the processing chamber 201, and the epitaxial growth is performed to the silicon surface.

At this time, the flow rate of the $SiH_2Cl_2$ (dichlorosilane) is set at 200 sccm, and the flow rate of the $H_2$ gas flow rate is set at 1000 sccm. The processing time is set at 60 minutes.

Comparative Example

In order to perform comparison, the wafer 200 of the same lot as that of the wafer 200 of an example is used, and the pre-processing is applied to the wafer 200, with the atmosphere temperature of the processing chamber 201 and the temperature of the wafer 200 set at 300° C., the pressure of the processing chamber 201 set at 50 Pa, and $SiH_4$ (silane) gas, being the reductive gas, set at 50 sccm and $H_2$ gas (hydrogen gas) set at 3500 sccm, and thereafter, the epitaxial growth is performed under the same epitaxial growth condition as that of the example.

At this time, the reduction processing time is set at 30 minutes, and the epitaxial growth time is set at 60 minutes.

Note that when the natural oxide film and the impurities of the wafer 200 are removed by the $SiH_4$ (silane) gas and the $H_2$ gas, preferably, the temperature of the processing chamber 201 and the wafer 200 is set at 200 to 400° C., the flow rate of the $SiH_4$ (silane) gas is set at 1 to 150 sccm, the flow rate of the $H_2$ gas (hydrogen gas) is set at 10 to 5000 sccm, the pressure of the processing chamber 201 is set at 300 Pa or less, and the processing time is set at 5 to 120 minutes.

Next, cleanliness of the interface was evaluated from an interface oxygen concentration of the wafer 200 of the example and the comparative example, by using an SIMS (Secondary Ionization Mass Spectrometer). A result was that the interface oxygen concentration of the example was 3.4 E12atoms/cm², and that of the comparative example was 1.8 E13atoms/cm². From this result, it is found that the $SiH_2Cl_2$ gas (dichlorosilane gas) is more excellent as the reduction gas, compared to the SiH4 (silane) gas.

In addition, conventionally, in order to remove the natural oxide film an the impurities on the silicon surface of the wafer 200 after etching, the temperature of the processing chamber 201 and the wafer 200 is set at 800° c. or more, and the $H_2$ gas is introduced as the reduction gas. However, in the manufacturing method of the semiconductor device according to the present invention, by using the $H_2$ gas, being the $SiH_2Cl_2$ gas and the dilution gas, the natural oxide film and the impurities on the silicon surface of the wafer 200 can be removed at a lower temperature of 600 to 700° C.

(Effect of this Example)

(1) In the manufacturing method of the semiconductor device from cleaning the silicon surface of the substrate until the epitaxial growth of the silicon surface is finished, the temperature of the substrate can be set at 800° C. or less. Therefore, possibility of thermal damage to a substrate element and increase of thermal budged can be significantly reduced.

(2) In addition, when the natural oxide film and the impurities are removed by reduction using silane-based gas, particularly the $SiH_2Cl_2$ (dichlorosilane gas), there is a possibility that the silicon film or the silicon nucleus is formed on the insulating film of the wafer, and also there is a possibility that a harmful influence such as a deflection in the selective growth thereafter occurs. However, in the manufacturing method of the semiconductor device according to this embodiment, such possibilities do not occur.

(3) Further, according to a substrate processing method of this embodiment and this example, etching is eliminated before the selective growth. Therefore, the epitaxial film can be allowed to selectively grow only on the silicon surface of the wafer in a state of a low interface oxygen concentration.

(4) Further, the processing from cleaning the silicon surface of the substrate until the epitaxial growth on the silicon surface is finished, is performed in the same processing chamber. Therefore, contamination can be prevented.

(Additional Description 1)

There is provided a manufacturing method of a semiconductor device for:

placing in a processing chamber a substrate having at least a silicon surface and an insulating film surface on a surface; and allowing an epitaxial film to selectively grow only on the silicon surface by using a substrate processing apparatus for heating an atmosphere in the processing chamber and the substrate, using a heating unit disposed outside of the processing chamber, the manufacturing method including:

a substrate loading step of loading the substrate into the processing chamber;

a pre-processing step of supplying dichlorosilane gas and hydrogen gas into the processing chamber while maintaining a temperature in the substrate processing chamber to a prescribed temperature of 700° C. or less, and removing a natural oxide film or impurities formed on the silicon surface; and a substrate unloading step of unloading the substrate to outside of the processing chamber.

(Additional Description 2)

There is provided the manufacturing method of the semiconductor device according to the additional description 1, wherein the prescribed temperature is a first temperature between 600° C. to 700° C.

(Additional Description 3)

There is provided a manufacturing method of a semiconductor device for:

placing in a processing chamber a substrate having at least a silicon surface and an insulating film surface on a surface; and allowing an epitaxial film to selectively grow only on the silicon surface by using a substrate processing apparatus for heating an atmosphere in the processing chamber and the substrate, using a heating unit disposed outside of the processing chamber, the manufacturing method includes:

a substrate loading step of loading the substrate into the processing chamber;

a pre-processing step of supplying dichlorosilane gas and hydrogen gas into the processing chamber while maintaining a temperature in the substrate processing chamber to a prescribed temperature of 700° C. or less, and removing a natural oxide film or impurities formed on the silicon surface; and a substrate unloading step of unloading the substrate to outside of the processing chamber, the pre-processing step and the epitaxial growing step being performed while the temperature of the substrate and the inside of the substrate processing chamber is maintained to a prescribed temperature of 800° C. or less.

(Additional Description 4)

There is provided the manufacturing method of the semiconductor device according to the additional description 3, wherein the pre-processing step is performed while the temperature of the substrate and the inside of the substrate processing chamber is maintained to a first temperature between 600° C. and 700° C., and the epitaxial growing step is performed while the temperature of the substrate and the inside of the substrate processing chamber is maintained to a second temperature between 680° C. and 800° C.

(Additional Description 5)

There is provided the manufacturing method of the semiconductor device according to the additional description 3, wherein the pre-processing step is performed while the temperature of the substrate and the inside of the substrate processing chamber is maintained to a first temperature between 600° C. and 700° C., and the epitaxial growing step is performed while the temperature of the substrate and the inside of the substrate processing chamber is maintained to a second temperature between 680° C. and 720° C., and in this state, only dichlorosilane gas and hydrogen gas are supplied to the processing chamber and the epitaxial film is allowed to grow only on the silicon surface.

(Additional Description 6)

There is provided the manufacturing method of the semiconductor device according to the additional description 3, wherein the pre-processing step is performed while the temperature of the substrate and the inside of the substrate processing chamber is maintained to a first temperature between 600° C. and 700° C., and the epitaxial growing step is performed while the temperature of the substrate and the inside of the substrate processing chamber is maintained to a second temperature between 720° C. and 800° C., and further a chlorine based gas is supplied to the processing chamber and the epitaxial film is allowed to grow only on the silicon surface.

(Additional Description 7)

There is provided a manufacturing method of a semiconductor device for:

placing in a processing chamber a substrate having at least a silicon surface and an insulating film surface on a surface; and allowing an epitaxial film to selectively grow only on the silicon surface by using a substrate processing apparatus for heating an atmosphere in the processing chamber and the substrate, using a heating unit disposed outside of the processing chamber, the manufacturing method includes:

a substrate loading step of loading the substrate into the processing chamber;

a pre-processing step of supplying dichlorosilane gas and hydrogen gas into the processing chamber while maintaining a temperature in the substrate processing chamber to a prescribed temperature, and removing a natural oxide film or impurities formed on the silicon surface;

a first epitaxial growing step of supplying the dichlorosilane gas and the hydrogen gas to the processing chamber under the same flow rate condition as that of the processing step, and allowing the epitaxial film to grow only on the silicon surface;

a second epitaxial growing step of supplying the dichlorosilane gas, chlorine-based gas, and hydrogen gas to the processing chamber under the same flow rate condition as that of the pre-processing step, and allowing the epitaxial film to grow only on the silicon surface; and a substrate unloading step of unloading the substrate to outside of the processing chamber, the pre-processing step and the epitaxial growing step being performed while the temperature of the substrate and the inside of the substrate processing chamber is maintained to a prescribed temperature of 800° C. or less.

(Additional Description 8)

There is provided the manufacturing method of the semiconductor device according to the additional description 7, wherein the pre-processing step is performed while the temperature of the substrate and the inside of the substrate processing chamber is maintained to a first temperature between 600° C. and 700° C., and the first epitaxial growing step is performed while the temperature of the substrate and the inside of the substrate is maintained to a second temperature between 680° C. and 800° C., and the second epitaxial growing step is performed while the temperature of the substrate and the inside of the substrate processing chamber is maintained to a third temperature between 720° C. and 800° C.

(Additional Description 9)

There is provided a pre-processing method of a selection epitaxial film growing method for:

placing in a processing chamber a substrate having at least a silicon surface and an insulating surface on a surface, and allowing an epitaxial film to selectively grow only on the silicon surface by using a substrate processing apparatus for heating the atmosphere in the processing chamber and the substrate using a heating unit disposed outside of the processing chamber, the pre-processing method further includes the step of:

supplying dichlorosilane gas and hydrogen gas to the processing chamber while the temperature of the substrate and the inside of the substrate processing chamber is maintained to a prescribed temperature of 700° C. or less, and removing a natural oxide film or impurities formed on the silicon surface.

(Additional Description 10)

There is provided the pre-processing method of the selection epitaxial film growing method according to the additional description 9, wherein the prescribed temperature is a first temperature obtained by maintaining the temperature of the substrate and the inside of the substrate processing chamber between 600° C. and 700° C.

(Additional Description 11)

There is provided a substrate processing apparatus, including:

a processing chamber that contains a substrate having at least a silicon surface and an insulating film surface on a surface;

a heating unit that heats an atmosphere in the processing chamber and the substrate;

a gas supply unit that supplies a desired gas to the processing chamber;

a pressure controller that controls a pressure in the processing chamber to a desired pressure;

an exhaust unit that exhausts an atmosphere in the processing chamber; and a controller that controls the heating unit, the gas supply unit, the pressure controller, and the exhaust unit, the controller controlling the heating unit and the gas supply unit so as to supply dichlorosilane gas and hydrogen gas while the temperature of the substrate and the processing chamber is maintained to a prescribed temperature of 700° C. or less, and removing a natural oxide film or impurities formed on the silicon surface.

(Additional Description 12)

There is provided the substrate processing apparatus according to the additional description 11, wherein the controller controls the heating unit and the gas supply unit so as to supply the dichlorosilane gas and the hydrogen gas while the temperature of the substrate and the inside of the processing chamber is maintained to a prescribed temperature between 600° C. and 700° C., and the natural oxide film or the impurities formed on the silicon surface are removed.

(Additional Description 13)

There is provided the substrate processing apparatus according to the additional description 11, wherein the controller controls the heating unit and the gas supply unit to supply the dichlorosilane gas and the hydrogen gas to the processing chamber while the temperature of the substrate and the inside of the processing chamber is maintained to 800° C. or less in the pre-processing step of removing the natural oxide film or impurities formed on the silicon surface and the epitaxial growing step of allowing the epitaxial film to grow selectively only on the silicon surface.

(Additional Description 14)

There is provided the substrate processing apparatus according to the additional description 13, wherein the controller controls the heating unit so as to maintain the temperature of the substrate and the inside of the processing chamber to a first temperature between 600° C. and 700° C. in the pre-processing step, and controls the heating unit so as to maintain the temperature of the substrate and the inside of the processing chamber to a second temperature between 680° C. and 800° C. in the epitaxial growing step.

(Additional Description 15)

There is provided the substrate processing apparatus according to the additional description 14, wherein the controller controls the heating unit and the gas supply unit so as to supply only dichlorosilane gas and the hydrogen gas to the processing chamber while the temperature of the substrate and the inside of the processing chamber is maintained to a prescribed temperature between 680° C. and 720° C. in the epitaxial growing step.

(Additional Description 16)

There is provided the substrate processing apparatus according to the additional description 14, wherein the con roll controls the heating unit and the gas supply unit so as to supply chlorine-based gas while the temperature of the substrate and the inside of the processing chamber is maintained to a prescribed temperature between 720° C. and 800° C.

(Additional Description 17)

There is provided the substrate processing apparatus according to the additional description 11, wherein the controller controls the gas supply unit so as to supply dichlorosilane gas and hydrogen gas to the processing chamber in the pre-processing step of removing the natural oxide film or impurities formed on the silicon surface, and controls the gas supply unit so as to supply the dichlorosilane gas and the hydrogen gas to the processing chamber in a first epitaxial growing step of allowing the epitaxial film to grow selectively only on the silicon surface, and controls the gas supply unit so as to supply the dichlorosilane gas, the chlorine-based gas and the hydrogen gas to the processing chamber in a second epitaxial growing step of allowing the epitaxial film to selectively grown only on the silicon surface, and further controls the heating unit so as to maintain the temperature of the substrate and the inside of the processing chamber to a prescribed temperature of 800° C. or less in the second epitaxial growing step.

(Additional Description 18)

There is provided the substrate processing apparatus according to the additional description 17, wherein the controller controls the heating unit so as to maintain the temperature of the substrate and the inside of the processing chamber to a first temperature between 600° C. and 700° C. in the pre-processing step, and controls the heating unit so as to maintain the temperature of the substrate and the inside of the processing chamber to a second temperature between 680° C. and 720° C. in the first epitaxial growing step, and controls the heating unit so as to maintain the temperature of the substrate and the inside of the processing chamber to a third temperature between 720° C. and 800° C. in the second epitaxial growing step.

(Additional Description 19)

There is provided a manufacturing method of a semiconductor device for:

placing in a processing chamber a substrate having at least a silicon surface and an insulating surface on a surface; supplying dichlorosilane gas and hydrogen gas to the processing chamber in a flow rate range from 1 to 300 sccm and 10 to 50000 sccm respectively; and allowing an epitaxial film to grow selectively only on the silicon surface under a condition that a pressure of the processing chamber is set at 300 Pa or less, the manufacturing method including:

the step of loading the substrate into the processing chamber;

a pre-processing step of supplying the dichlorosilane gas and the hydrogen gas into the processing chamber while heating the substrate and the inside of the processing chamber to 600 to 700° C., and removing a natural oxide film or impurities formed on the silicon surface; and an epitaxial growing step of supplying the dichlorosilane gas and the hydrogen gas to the processing chamber under the same flow rate condition as that of the pre-processing step, while the substrate and the inside of the substrate processing chamber are heated to the temperature of 680 to 800° C., and allowing the epitaxial film to grow only on the silicon surface.
(Additional Description 20)
There is provided a manufacturing method of a semiconductor device, for supplying dichlorosilane gas and hydrogen gas to the processing chamber in a flow rate range from 1 to 300 sccm and 10 to 50000 sccm respectively, and allowing an epitaxial film to grow selectively only on the silicon surface under a condition that a pressure of the processing chamber is set at 300 Pa or less, by using a substrate processing apparatus, with a substrate having at least silicon surface and insulating film surface on a surface placed in a processing chamber, and an atmosphere in the processing chamber and the substrate heated to a temperature of 600 to 800° C., using a heating unit disposed outside of the processing chamber, the manufacturing method includes:

the step of loading the substrate into the processing chamber;

the step of heating the substrate and an inside of the substrate processing chamber to 600 to 700° C.;

a pre-processing step of supplying the dichlorosilane gas and the hydrogen gas into the processing chamber and removing a natural oxide film or impurities formed on the silicon surface;

a first epitaxial growing step of supplying the dichlorosilane gas and the hydrogen gas to the processing chamber under the same flow rate condition as that of the pre-processing step while the temperature of the substrate and the inside of the substrate processing chamber is heated to 680 to 720° C., and allowing the epitaxial film to grow only on the silicon surface; and a second epitaxial growing step of supplying the dichlorosilane gas and the hydrogen gas to the processing chamber under the same flow rate condition as that of the pre-processing step and allowing the epitaxial film to grow only on the silicon surface.

Note that in the aforementioned embodiment, explanation is given for a case of using a vertical CVD apparatus as the substrate processing apparatus. However, the present invention is not limited thereto, and the substrate processing apparatus in general, for example, a sheet type hot wall type substrate processing apparatus or a sheet type cold wall type substrate processing apparatus may be used. In addition, the film or the layer to be deposited is not limited to the epitaxial growth film or the layer, and can be applied to an overall technique of depositing the film such as a poly-silicon film on the substrate surface by using a chemical reaction.

What is claimed is:

1. A manufacturing method of a semiconductor device for:
placing in a processing chamber a substrate that has at least a silicon surface and an insulating film surface on a surface, and in which a natural oxide film or impurities is formed on the silicon surface and the insulating film surface; and forming a silicon single crystal film selectively only on the silicon surface by using a substrate processing apparatus for heating an atmosphere in the processing chamber and the substrate, using a heating unit disposed outside of the processing chamber, the manufacturing method comprising:

a substrate loading step of loading the substrate into the processing chamber;

a pre-processing step of supplying dichlorosilane gas and hydrogen gas into the processing chamber while maintaining a temperature of the substrate and an inside of the substrate processing chamber to a prescribed temperature of 800° C. or less, and removing the natural oxide film or the impurities formed on the silicon surface and the insulating film surface;

a first epitaxial growing step of supplying the dichlorosilane gas and the hydrogen gas to the processing chamber under the same flow rate condition as that of the pre-processing step, and forming a first silicon single crystal film selectively only on the silicon surface;

a second epitaxial growing step of supplying the dichlorosilane gas and hydrogen gas to the processing chamber under the same flow rate condition as that of the pre-processing step, and further supplying a second chlorine-based gas in addition to the dichlorosilane gas, and forming a second silicon single crystal film selectively on the first silicon single crystal film formed by the first epitaxial growing step; and a substrate unloading step of unloading the substrate to outside of the processing chamber.

2. The manufacturing method of the semiconductor device according to claim 1, wherein the pre-processing step is performed while the temperature of the substrate and the inside of the substrate processing chamber is maintained to a first temperature between 600° C. and 700° C., and the first epitaxial growing step is performed while the temperature of the substrate and the inside of the substrate processing chamber is maintained to a second temperature between 680° C. and 800° C., and the second epitaxial growing step is performed while the temperature of the substrate and the inside of the substrate processing chamber is maintained to a third temperature between 720° C. and 800° C.

3. The manufacturing method of the semiconductor device according to claim 1, wherein the first epitaxial growing step and the second epitaxial growing step are performed while the temperature of the substrate and the inside of the substrate processing chamber is maintained to a prescribed temperature of 800° C. or less.

4. The manufacturing method of the semiconductor device according to claim 1, wherein the first epitaxial growing step is performed while the temperature of the substrate and the inside of the substrate processing chamber is maintained to a prescribed temperature between 680° C. and 800° C., and the second epitaxial growing step is performed while the temperature of the substrate and the inside of the substrate processing chamber is maintained to a prescribed temperature between 720° C. and 800° C.

5. A manufacturing method of a semiconductor device for:
placing in a processing chamber a substrate that has at least a silicon surface and an insulating film surface on a surface, and in which a natural oxide film or impurities is formed on the silicon surface and the insulating film surface; and forming a silicon single crystal film selectively only on the silicon surface by using a substrate processing apparatus for heating an atmosphere in the processing chamber and the substrate, using a heating unit disclosed outside of the processing chamber, the manufacturing method comprising:

a substrate loading step of loading the substrate into the processing chamber;

a pre-processing step of supplying dichlorosilane gas and hydrogen gas into the processing chamber while maintaining a temperature of the substrate and an inside of the substrate processing chamber to a prescribed temperature of 800° C. or less, and removing the natural oxide film or the impurities formed on the silicon surface and the insulating film surface;

a first epitaxial growing step of supplying the dichlorosilane gas of a prescribed gas flow rate between 1 sccm and 300 sccm and the hydrogen gas of a prescribed gas flow rate between 10 sccm and 50000 sccm to the processing chamber while maintaining the temperature of the substrate and the inside of the processing chamber to a prescribed temperature between 680° C. and 720° C., and forming a first silicon single crystal film selectively only on the silicon surface, after the pre-processing step;

a second epitaxial growing step of supplying the dichlorosilane gas of a prescribed gas flow rate between 1 sccm and 300 sccm, the hydrogen gas of a prescribed gas flow rate between 10 sccm and 50000 sccm, and a second chlorine-based gas in addition to the dichlorosilane gas of a prescribed gas flow rate between 1 sccm and 300 sccm to the processing chamber while maintaining the temperature of the substrate and the inside of the processing chamber to a prescribed temperature between 720° C. and 800° C., and forming a second silicon single crystal film selectively on the first silicon single crystal film formed by the first epitaxial growing step, after the first epitaxial growing step; and a substrate unloading step of unloading the substrate to outside of the processing chamber.

6. The manufacturing method of the semiconductor device according to claim 5, wherein the first epitaxial growing step and the second epitaxial growing step are performed while maintaining the pressure in the processing chamber at 300 Pa or less.

7. A manufacturing method of a semiconductor device for:

placing in a processing chamber a substrate that has at least a silicon surface and an insulating film surface on a surface, and in which a natural oxide film or impurities is formed on the silicon surface and the insulating film surface; and forming a silicon single crystal film selectively only on the silicon surface by using a substrate processing apparatus for heating an atmosphere in the processing chamber and the substrate, using a heating unit disposed outside of the processing chamber, the manufacturing method comprising:

a substrate loading step of loading the substrate into the processing chamber;

a pre-processing step of supplying dichlorosilane gas and hydrogen gas into the processing chamber while maintaining a temperature of the substrate and an inside of the substrate processing chamber to a prescribed temperature of 800° C. or less, and removing the natural oxide film or the impurities formed on the silicon surface and the insulating film surface;

a first epitaxial growing step of supplying the dichlorosilane gas and the hydrogen gas to the processing chamber, and forming a first silicon single crystal film selectively only on the silicon surface, after the pre-processing step;

a second epitaxial growing step of supplying the dichlorosilane gas, a second chlorine-based gas in addition to the dichlorosilane gas and hydrogen gas to the processing chamber, and forming a second silicon single crystal film selectively on the first silicon single crystal film formed by the first epitaxial growing step; and a substrate unloading step of unloading the substrate to outside of the processing chamber wherein the second epitaxial growing step is performed while a temperature of the substrate and the inside of the substrate processing chamber is maintained to a temperature higher than the temperature of the substrate and the inside of the substrate processing chamber of the first epitaxial growing step.

8. The manufacturing method of the semiconductor device according to claim 7, wherein the first epitaxial growing step is performed while the temperature of the substrate and the inside of the substrate processing chamber is maintained to a temperature between 680° C. to 800° C., and the second epitaxial growing step is performed while the temperature of the substrate and the inside of the substrate processing chamber is maintained to a temperature between 720° C. and 800° C.

* * * * *